United States Patent
Koo et al.

(10) Patent No.: US 9,123,548 B1
(45) Date of Patent: Sep. 1, 2015

(54) SEMICONDUCTOR DEVICE AND METHOD OF FABRICATING THE SAME

(71) Applicant: Electronics and Telecommunications Research Institute, Daejeon (KR)

(72) Inventors: Jin-Gun Koo, Daejeon (KR); Jong Il Won, Daejeon (KR); Hyun-cheol Bae, Daejeon (KR); Sang Gi Kim, Daejeon (KR); Yil Suk Yang, Daejeon (KR)

(73) Assignee: ELECTRONICS AND TELECOMMUNICATIONS RESEARCH INSTITUTE, Daejeon (KR)

(*) Notice: Subject to any disclaimer, the term of this patent is extended or adjusted under 35 U.S.C. 154(b) by 0 days.

(21) Appl. No.: 14/449,028

(22) Filed: Jul. 31, 2014

(30) Foreign Application Priority Data

Feb. 10, 2014 (KR) .................. 10-2014-0015010

(51) Int. Cl.
*H01L 29/06* (2006.01)
*H01L 29/10* (2006.01)
*H01L 21/8249* (2006.01)

(52) U.S. Cl.
CPC ........ *H01L 29/0634* (2013.01); *H01L 21/8249* (2013.01); *H01L 29/1095* (2013.01)

(58) Field of Classification Search
CPC ............ H01L 27/0623; H01L 29/0634; H01L 29/1095; H01L 29/66734; H01L 29/7802; H01L 29/7811; H01L 29/7813; H01L 21/823456; H01L 21/8249; H01L 29/66712
See application file for complete search history.

(56) References Cited

U.S. PATENT DOCUMENTS

| | | | |
|---|---|---|---|
| 5,053,838 A | 10/1991 | Fujihira | |
| 5,119,162 A | 6/1992 | Todd et al. | |
| 2009/0273027 A1* | 11/2009 | Adan et al. | 257/334 |
| 2012/0098057 A1 | 4/2012 | Kim et al. | |

FOREIGN PATENT DOCUMENTS

KR 10-1158393 B1 6/2012

OTHER PUBLICATIONS

Kimimori Hamada et al., "A 60V BiCDMOS Device Technology for Automotive Applications", IEEE ISA, 1995, pp. 986-990, vol. 2.
T. Dyer et al., "Monolithic Integration of Trench Vertical DMOS (VDMOS) Power Transistors into a BCD Process", Proceedings of the 17th International Symposium on Power Semiconductor Devices & IC's, May 23-26, 2005, pp. 1-4, IEEE.

* cited by examiner

*Primary Examiner* — Roy Potter
*Assistant Examiner* — Paul Patton

(57) ABSTRACT

Provided is a semiconductor device. The semiconductor device includes: a first semiconductor layer having a first region with a first device and a second region with a second device; a device isolation pattern provided in the first semiconductor layer and electrically separating the first device and the second device from each other; a drain provided on a lower surface of the first region of the first semiconductor layer; and a second semiconductor layer provided on a lower surface of the second region of the first semiconductor layer.

18 Claims, 22 Drawing Sheets

SEMICONDUCTOR DEVICE AND METHOD OF FABRICATING THE SAME

CROSS-REFERENCE TO RELATED APPLICATIONS

This U.S. non-provisional patent application claims priority under 35 U.S.C. §119 to Korean Patent Application No. 10-2014-0015010, filed on Feb. 10, 2014, the entire contents of which are hereby incorporated by reference.

BACKGROUND

The invetive concept disclosed herein relates to semiconductor devices, and more particularly, to smart power IC bipolar-CMOS-DMOS (BCD) devices and methods of fabricating the same.

Semiconductor devices included in various electronic devices such as home appliances are important components determining the quality of electronic devices. According to the trends on the large capacity, multi-function, and miniaturization of electronic devices, semiconductor devices having improved reliability and other characteristics are demanded increasingly. In order to meet such demands, various techniques for improving the characteristics of semiconductor devices are being introduced.

Recently, smart power ICs in which various power device functions are integrated into one chip emerge as a new high-growth area. The smart power ICs are typically used for implementing a high frequency and high voltage information communication system such as an automotive power IC and a DC/DC converter. A typical bipolar-CMOS-DMOS (BCD) type power IC uses a VDMOS device generally but this may increase on-resistance and deteriorate driving capability.

SUMMARY

The inventive concept provides a semiconductor device including a power control device, a signal control device, and a current control device.

The inventive concept also provides a highly reliable semiconductor device.

Embodiments of inventive concepts provide semiconductor devices including: a first semiconductor layer having a first region with a first device and a second region with a second device; a device isolation pattern provided in the first semiconductor layer and electrically separating the first device and the second device from each other; a drain provided on a lower surface of the first region of the first semiconductor layer; and a second semiconductor layer provided on a lower surface of the second region of the first semiconductor layer.

In some embodiments, the semiconductor devices may further include a sidewall insulation pattern between the drain and the second semiconductor layer.

In other embodiments, the semiconductor devices may further include an ohmic contact layer between the first semiconductor layer and the drain.

In still other embodiments, the drain may extend on a lower surface of the second semiconductor layer.

In even other embodiments, the device isolation pattern may penetrate the first semiconductor layer and may extend into the second semiconductor layer.

In yet other embodiments, a conductive type of the first semiconductor layer may be an n-type and a conductive type of the second semiconductor layer may be a p-type.

In further embodiments, the first semiconductor layer may include a first epi layer contacting the second semiconductor layer and a second epi layer on the first epi layer; and the first epi layer may have an impurity concentration higher than that of the second epi layer.

In still further embodiments, the first device may be a diffused metal-oxide-semiconductor (DMOS) transistor.

In even further embodiments, the first device may include a source and a buried gate electrode, wherein the source and the buried gate electrode may be connected to metal lines provided on the first semiconductor layer.

In yet further embodiments, the second device may be a complementary metal-oxide semiconductor (CMOS) device.

In yet further embodiments, the first semiconductor layer may further have a third region with a third device, wherein the third device may be a bipolar transistor.

In other embodiments of the inventive concept, methods of fabricating a semiconductor device include: sequentially forming first and second epi layers on a substrate having a first region, a second region, and a third region; removing a portion of the first region of the substrate to expose the first epi layer; and forming a drain on a lower surface of the exposed first epi layer.

In some embodiments, the forming of the drain may include performing a plating process or a screen print process.

In still other embodiments, the methods may further include forming device isolation patterns on the substrate, wherein the forming of the device isolation patterns may include: forming trenches penetrating the first and second epi layers on the substrate and extending into the substrate; forming trench insulation patterns covering a sidewall of the trenches; and forming trench gap fill patterns filling the trenches where the trench insulation patterns are formed, wherein the trench gap fill patterns include a polycrystalline silicon layer.

In even other embodiments, the methods may further include thinning the substrate before the removing of the portion of the first region, wherein the thinning of the substrate may include performing a grinding process.

In yet other embodiments, the methods may further include forming a sidewall insulation pattern on a sidewall of the substrate where the portion of the first region is removed before the forming of the drain, wherein the forming of the sidewall insulation pattern may include: forming a protective oxide layer covering the sidewall on the lower surface of the substrate; and performing a blanket anisotropic etching process on the lower surface of the substrate where the protective layer is formed.

In further embodiments, the methods may further include forming an ohmic contact layer on a lower surface of the exposed first epi layer before the forming of the drain, wherein the forming of the ohmic contact layer may include performing a metal deposition process or a plating process.

In still further embodiments, the methods may further include: forming a DMOS device on the first region; forming a CMOS device on the second region; and forming a bipolar device on the third region.

BRIEF DESCRIPTION OF THE DRAWINGS

The accompanying drawings are included to provide a further understanding of the inventive concept, and are incorporated in and constitute a part of this specification. The drawings illustrate exemplary embodiments of inventive concepts and, together with the description, serve to explain principles of the inventive concept. In the drawings.

DETAILED DESCRIPTION OF PREFERRED EMBODIMENTS

Figure 1:
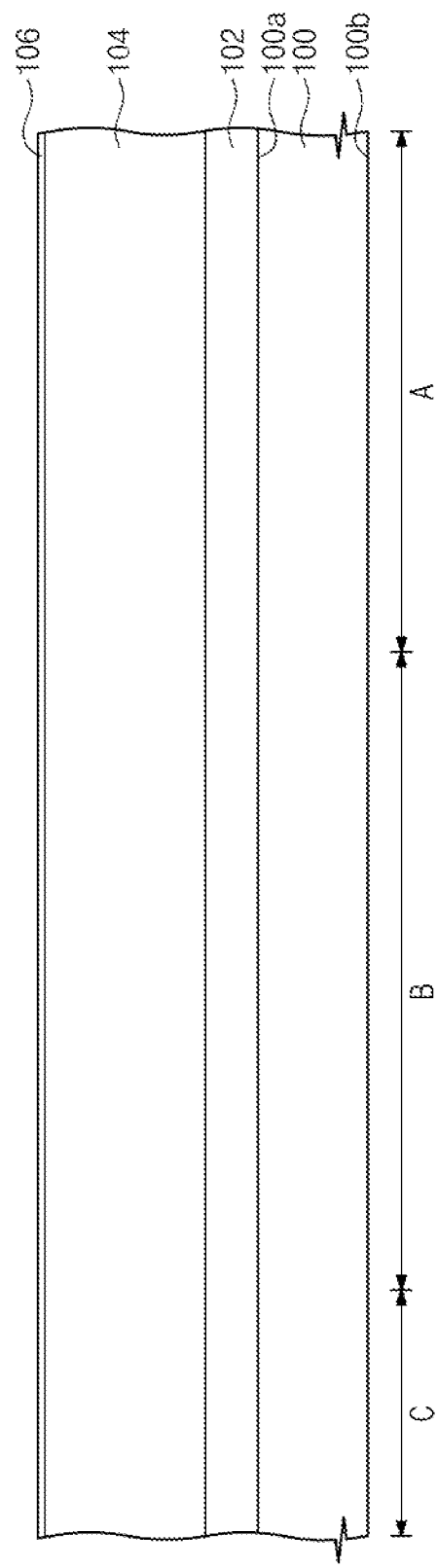
FIGS. 1 to 22 are views illustrating a semiconductor device and a method of fabricating the same according to embodiments of inventive concepts.

Preferred embodiments of inventive concepts will be described below in more detail with reference to the accompanying drawings. Preferred embodiments of inventive concepts may, however, be embodied in different forms and should not be constructed as limited to the embodiments set forth herein. Rather, these embodiments are provided so that this disclosure will be thorough and complete, and will fully convey the scope of the inventive concept to those skilled in the art.

In the drawings, the dimensions of layers and regions are exaggerated for clarity of illustration. It will also be understood that when a layer (or film) is referred to as being 'on' another layer or substrate, it can be directly on the other layer or substrate, or intervening layers may also be present. The terms 'first' and/or 'second' may be used to describe various elements, however, the elements should not be limited by these terms. These terms are merely used for the purpose of discriminating one element from another element, and, for example, the first element may be designated as the second element, and vice versa, without departing from the spirit or scope of the inventive concept.

Hereinafter, it will be described about an exemplary embodiment of the inventive concept in conjunction with the accompanying drawings.

FIGS. 1 to 22 are views illustrating a semiconductor device and a method of fabricating the same according to embodiments of inventive concepts.

Referring to FIG. 1, a substrate 100 including a first region A, a second region B, and a third region C is provided. The substrate 100 may be a semiconductor substrate, for example, one of a silicon substrate and a germanium substrate. The substrate 100 may be a substrate doped with an impurity. As an example, the substrate 100 may be a p– substrate. Different devices may be formed in such regions A, B, and C. The substrate 100 may have an upper surface 100a where a plurality of devices are formed and a lower surface 100b facing the upper surface 100a.

A semiconductor layer may be formed on the substrate 100. The semiconductor layer may include a first epi layer 102 and a second epi layer 104, which are sequentially formed on the upper surface 100a of the substrate 100. The first and second epi layers 102 and 104 may be formed on the substrate 100 by performing an epitaxial process. The epi layers 102 and 104 may include first to third regions A, B, and C like the substrate 100. The epitaxial process may be performed by using a semiconductor material such as silicon or germanium or a group III-V compound semiconductor material. The epi layers 102 and 104 may include the same material and may be doped in-situ. The first epi layer 102 may be doped with a different conductive type and a higher impurity concentration than the substrate 100. As an example, the first epi layer 102 may be an n+ epi layer. The second epi layer 104 may be doped with the same conductive type as the first epi layer 102 and a lower impurity concentration than the first epi layer 102. As an example, the second epi layer 104 may be an n– epi layer. Then, a first oxide layer 106 may be formed on the second epi layer 104. The first oxide layer 106 may be formed by performing a deposition process. As an example, the first oxide layer 106 may include a silicon oxide layer.

Figure 2:
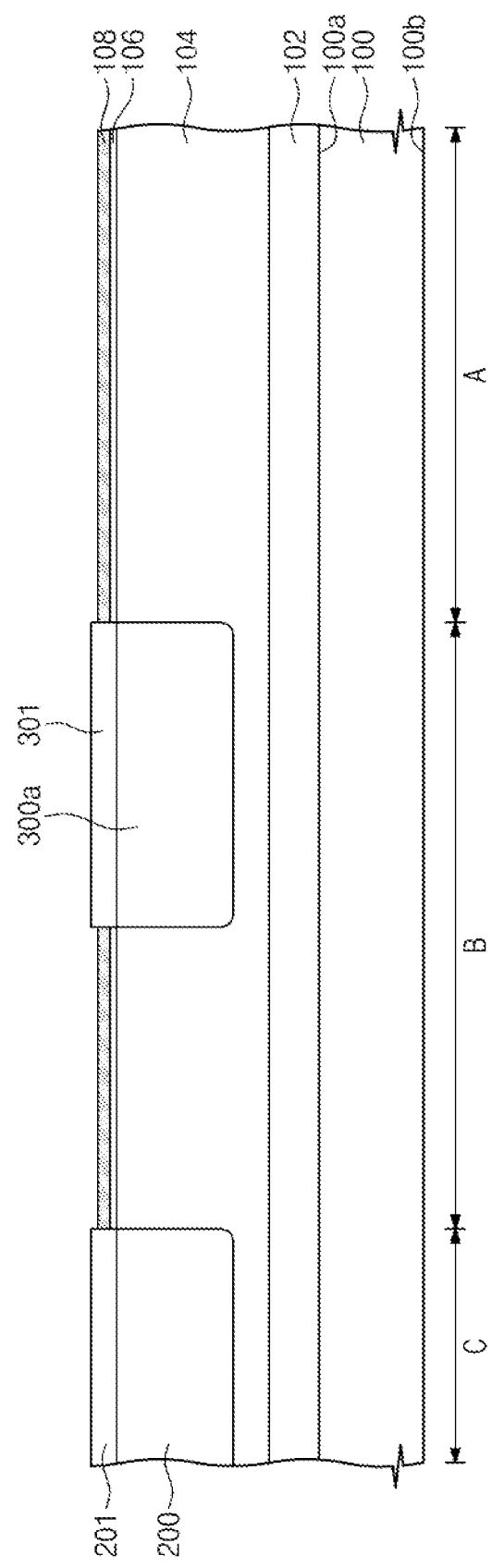

Referring to FIG. 2, a collector 200 may be formed in the second epi layer 104 of the third region C and an n-well 300a may be formed in the second epi layer 104 of the second region B.

The collector 200 and the n– well 300a may be formed by forming a first nitride layer pattern 108 on the first oxide layer 106 and then ion-implanting an n-type impurity by using the first nitride layer pattern 108 as a mask. The n-type impurity may include phosphorus. The first nitride layer pattern 108 may be formed by depositing a nitride layer on the first oxide layer 106 and pattering this. As an example, the nitride layer may include a silicon nitride layer. The first nitride layer pattern 108 may expose the first oxide layer 106 on a portion where the collector 200 and the n– well 300a are to be formed. The collector 200 may be formed to contact the second epi layer 104 of the third region C but to be spaced from the first epi layer 102. In the same manner, the n– well 300a may be formed to contact the epi layer of the second region B but to be spaced from the first epi layer 102. The collector 200 and the n– well 300a may be formed simultaneously.

Then, second oxide layers 201 and 301 may be formed on the collector 200 and the n– well 300a. The second oxide layers 201 and 301 may be formed through a local oxidation of silicon process and may be formed to be thicker than the first oxide layer 106. After the forming of the second oxide layers 201 and 301, a thermal treatment process may be performed.

Figure 3:
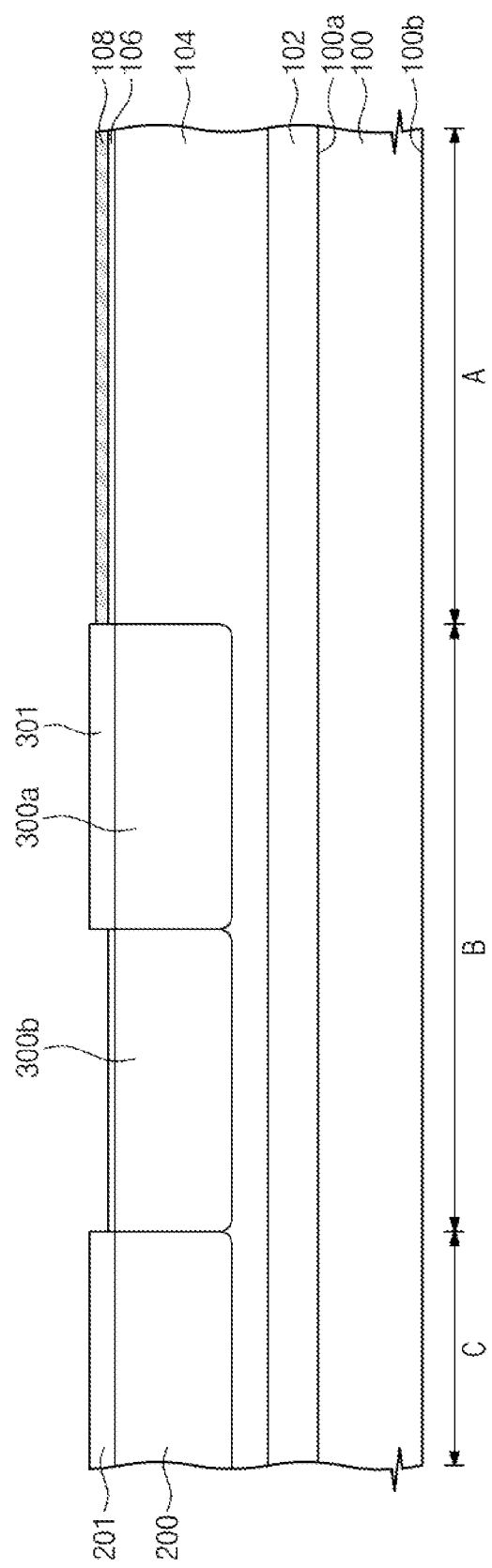

Referring to FIG. 3, a p– well 300b may be formed in the second epi layer 104 of the second region B. The p– well 300b may be formed by patterning the first nitride layer pattern 108 on the second region B to expose the first oxide layer 106 between the second oxide layers 201 and 301 and then ion-implanting a p-type impurity. The p– well 300b may be formed in the second epi layer 104 between the collector 200 and the n– well 300a and may be formed to be spaced from the first epi layer 102. The p-type impurity may be boron. After the ion-implanting of the p-type impurity, a thermal treatment process may be performed.

Figure 4:
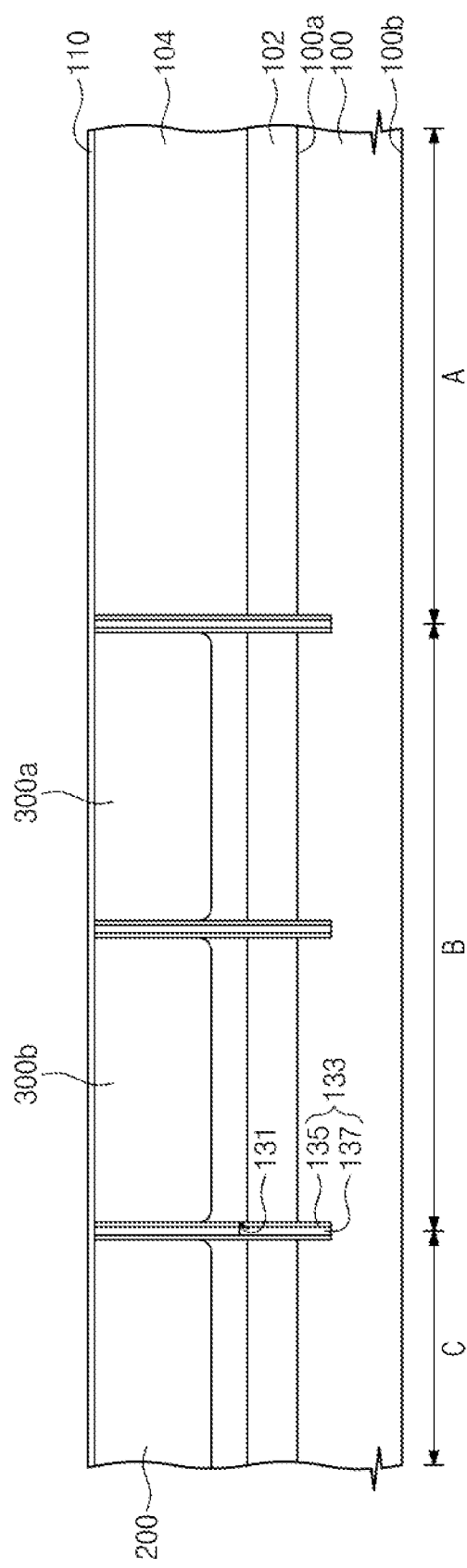

Referring to FIG. 4, device isolation patterns 133 may be formed in the first and second epi layers 102 and 104 after the first nitride layer pattern 108, the first oxide layer 106, and the second oxide layers 201 and 301 are removed.

The device isolation patterns 133 may be formed by forming trenches 131 extending into the substrate 100 after penetrating the first and second epi layers 102 and 104 in the substrate 100 and forming trench insulation patterns 135 and trench gap fill patterns 137 filling the trenches 131. That is, the device isolation patterns 133 may include the trench insulation patterns 135 and the trench gap fill patterns 137 and may penetrate the first and second epi layers 102 and 104 to extend into the substrate 100.

The trench 131 may be formed by forming a mask pattern on the substrate 100 where the first nitride layer pattern 108, the first oxide layer 106, and the second oxide layers 201 and 301 of FIG. 3 are removed and performing an anisotropic etching process by using the mask pattern as an etch mask. Then, an oxide layer may be formed in the trenches 131 by performing a thermal oxidation process on the substrate 100 having the formed trenches 131 and trench insulation patterns 135 may be formed by performing a blanket anisotropic etching process to expose the bottom surfaces of the trenches 131. Then, a polycrystalline silicon layer filling the trenches 131 having the formed trench insulation patterns 135 may be formed and trench gap fill patterns 137 may be formed by performing a planarization process until an upper surface of the second epi layer 104 is exposed. The planarization process may include a chemical mechanical polishing (CMP) process. The device isolation patterns 133 formed through the above trench isolation technique may isolate devices from each other.

Then, a third oxide layer 110 may be formed on the substrate 100 having the formed device isolation patterns 133. As an example, the third oxide layer 110 may be a silicon oxide layer.

Figure 5:
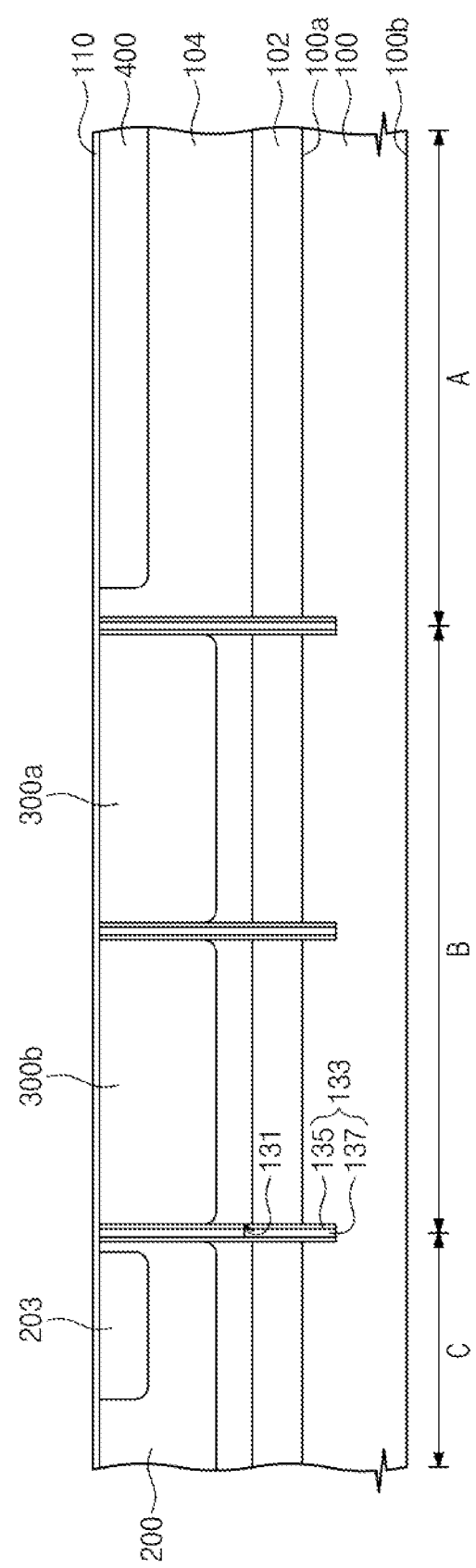

Referring to FIG. 5, a base 203 may be formed in the third region C of the second epi layer 104 and a p– body region 400 may be formed in the first region A of the second epi layer 104. The base 203 and the p– body region 400 may be formed by forming a mask pattern (not shown) on the third oxide layer 110 and performing an ion implantation process by using the mask pattern (not shown) as an ion implantation mask, and a thermal treatment process. The ion implantation process may include ion-implanting a p-type impurity on the substrate 100 having the formed mask pattern (not shown). As an example, the p-type impurity may include boron. The base 203 may be formed in the collector 200 of the third region C and the p– body region 400 may be formed in the second epi layer 104. The base 203 and the p– body region 400 may be formed simultaneously. Then, the mask pattern (not shown) may be removed.

Figure 6:
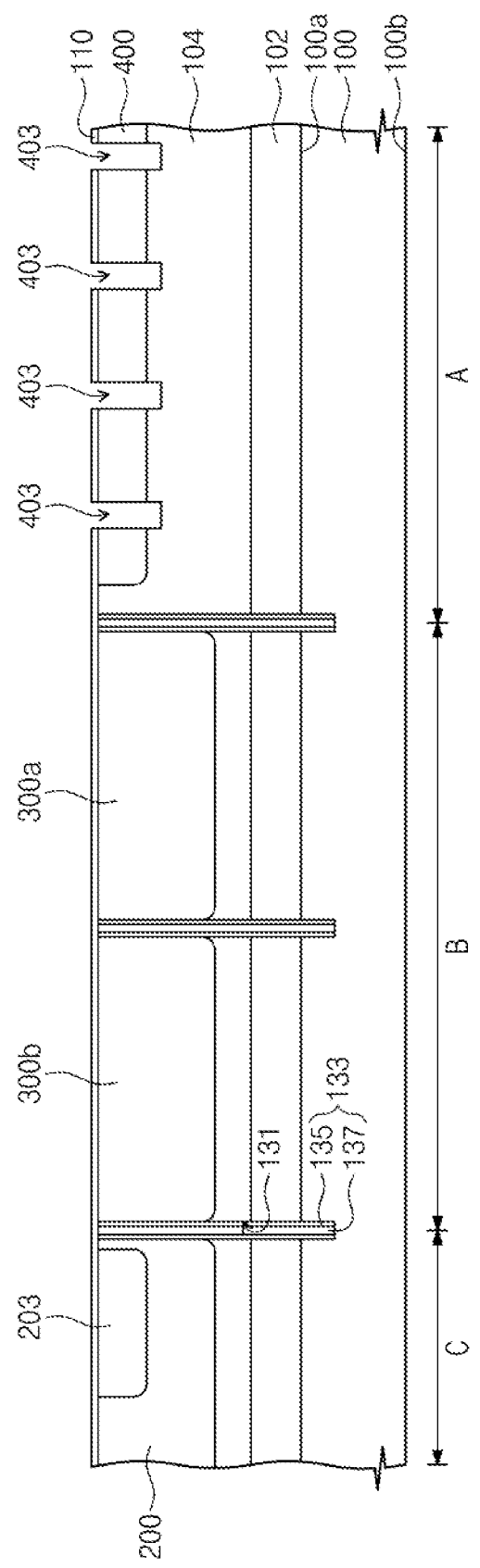

Referring to FIG. 6, gate trenches 403 may be formed in the p– body region 400 of the first region A. The gate trenches 403 may be formed by forming a mask pattern (not shown) on the third oxide layer 110 and performing an anisotropic etching process by using the mask pattern (not shown) as a mask. The gate trenches 403 may be etched to be deeper than the p– body region 400 and may extend into the second epi layer 104.

Figure 7:
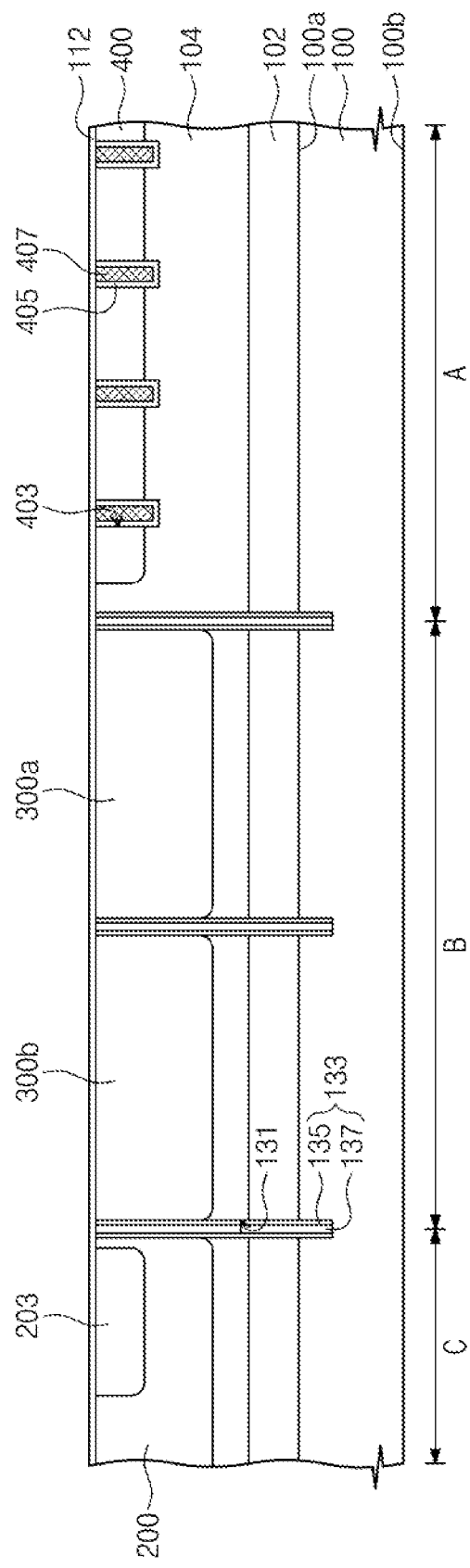

Referring to FIG. 7, buried gate oxide layers 405 and buried gate electrodes 407 may be formed in the gate trenches 403.

According to an embodiment of the inventive concept, the buried gate oxide layers 405 may be formed after reducing a surface curvature in the gate trenches 403 by growing a sacrificial oxide layer in the gate trenches 403 and wet-etching the sacrificial oxide layer. The buried gate electrodes 407 may be formed by forming a polycrystalline silicon layer filling the gate trenches 403 on the substrate 100 having the formed buried gate oxide layers 405 and performing a planarization process until the upper surface 100a of the second epi layer 104 is exposed. As a result, the buried gate electrodes 407 may be formed to be buried in the gate trenches 403 in terms of the form. The buried gate electrodes 407 may include an impurity. As an example, the impurity may include phosphorus. The planarization process may include a CMP and/or dry etching process. During the planarization process, the third oxide layer 110 may be removed together.

Then, a fourth oxide layer 112 may be formed on the substrate 100 having the formed buried gate electrodes 407. As an example, the fourth oxide layer 112 may include a silicon oxide layer.

Figure 8:
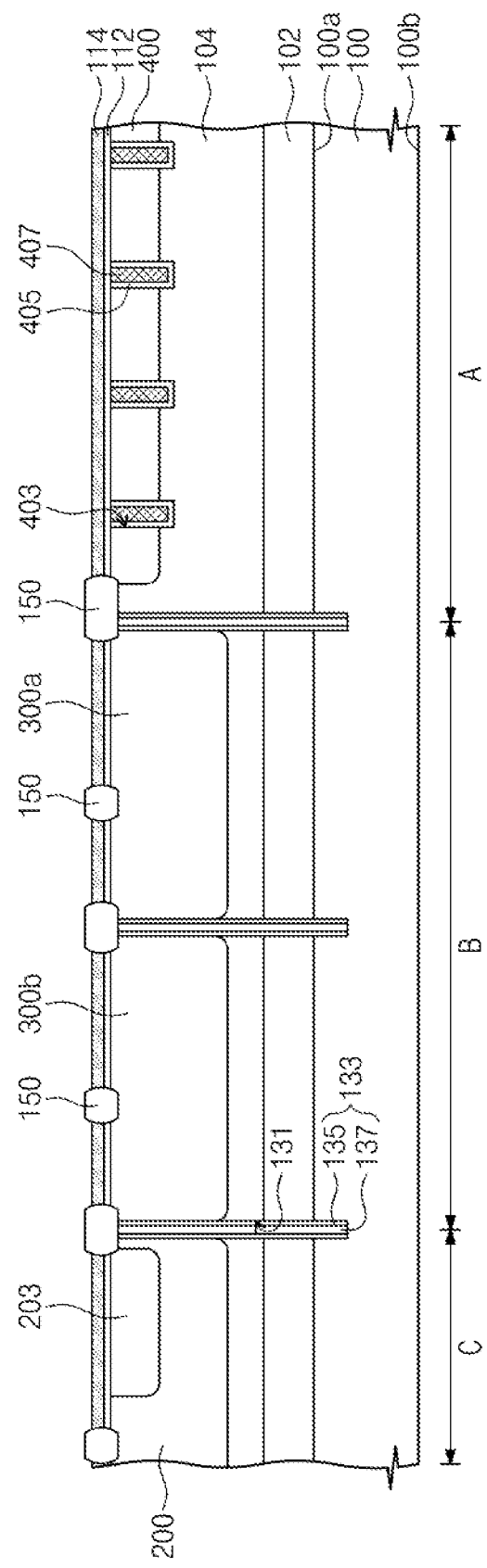

Referring to FIG. 8, field oxide layers 150 may be formed on the substrate 100 having the fourth oxide layer 112. The field oxide layers 150 may be formed by forming a second nitride layer pattern 114 defining an active region on the fourth oxide layer 112 and performing a local oxidation of silicon (LOCOS) process. Here, the active region means a portion covered by the second nitride layer pattern 114. The second nitride layer pattern 114 may be formed by forming a mask pattern (not shown) on a nitride layer after forming the nitride layer on the fourth oxide layer 112 and then, performing an etching process by using the mask pattern (not shown) as an etch mask. The second nitride layer pattern 114 may expose the fourth oxide layer 112 at a portion where the field oxide layers 150 are to be formed. The field oxide layers 150 may be formed in a portion exposed by the second nitride layer pattern 114 and may be formed to be thicker than the fourth oxide layer 112. According to an embodiment of the the inventive concept, before forming the field oxide layers 150, an ion implantation process using the second nitride layer pattern 114 as an ion implantation mask may be performed. The ion implantation process may be performed to adjust a field threshold voltage and may include ion-implanting boron, for example.

Figure 9:
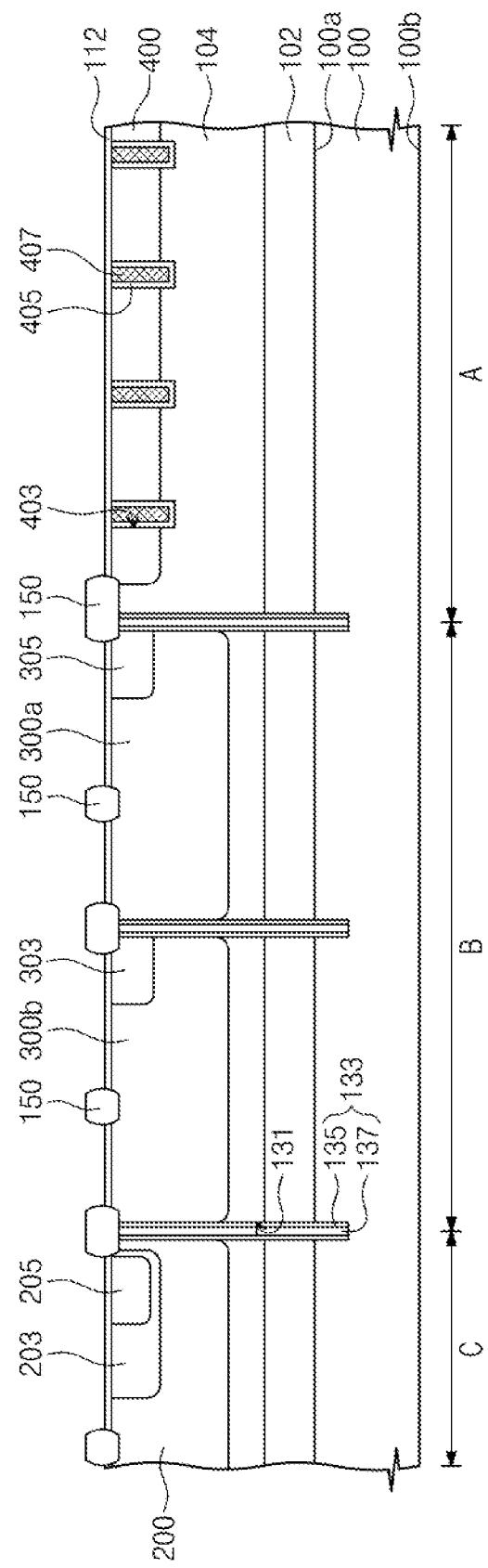

Referring to FIG. 9, after the second nitride layer pattern 114 of FIG. 8 is removed, an emitter 205 may be formed in the third region C of the second epi layer 104, and an n– drift region 303 and a p– drift region 305 may be formed in the second region B of the second epi layer 104.

The emitter 205 and the n– drift region 303 may be formed by forming an ion implantation mask (not shown) defining the emitter 205 and the n– drift region 303 on the substrate 100 where the second nitride layer pattern 114 of FIG. 8 is removed and ion-implanting an impurity such as phosphorus. The p– drifter region 305 may be formed by forming an ion implantation mask (not shown) defining the p– drifter region 305 on the substrate 100 where the second nitride layer pattern 114 of FIG. 8 is removed and ion-implanting an impurity such as boron. The emitter 205 and the n– drift region 303 may be formed simultaneously and then, the p– drift region 305 may be formed. On the contrary, the p– drift region 305 may be formed first and then the emitter 205 and the n– drift region 303 may be formed. The emitter 205 may be formed in the base 203. The n– drift region 303 may be formed in the p– well 300b and the p– drift region 305 may be formed in the n– well 300a. After an ion implantation process for forming the emitter 205, the n– drift region 303, and the p– drift region 305, a thermal treatment process may be performed.

Figure 10:
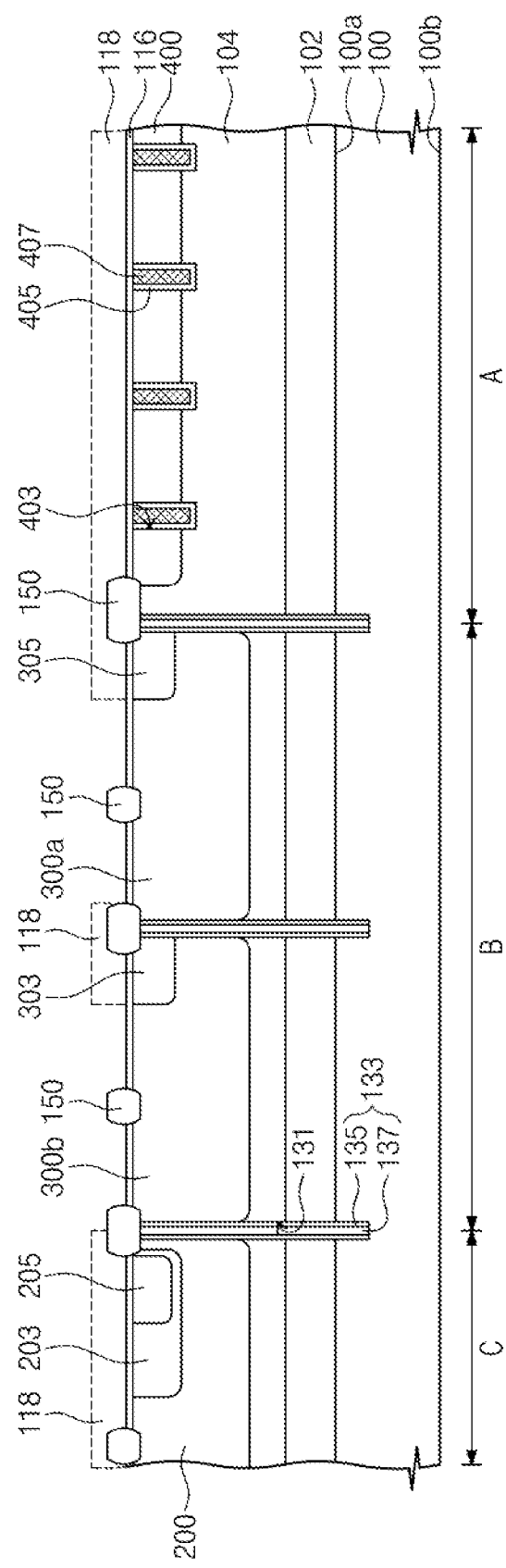

Referring to FIG. 10, an ion implantation process for removing the fourth oxide layer 112 of FIG. 9 and forming a fifth oxide layer 116 so as to adjust a threshold voltage may be performed. The fourth oxide layer 112 of FIG. 9 may be removed by performing a wet etching process.

The ion implantation process for threshold voltage adjustment may include forming a first photosensitive mask 118 exposing the second region B on the substrate 100 having the fifth oxide layer 116 and then ion-implanting boron or phosphorus. Such an ion implantation process may be performed so as to adjust a threshold voltage of a second device formed in the second region B to a desired range. The threshold voltage may be adjusted by changing a doping concentration of the n– well 300a and/or the p– well 300b in the second region by ion-implanting boron or phosphorus. Then, the first photosensitive mask 118 may be removed.

Figure 11:
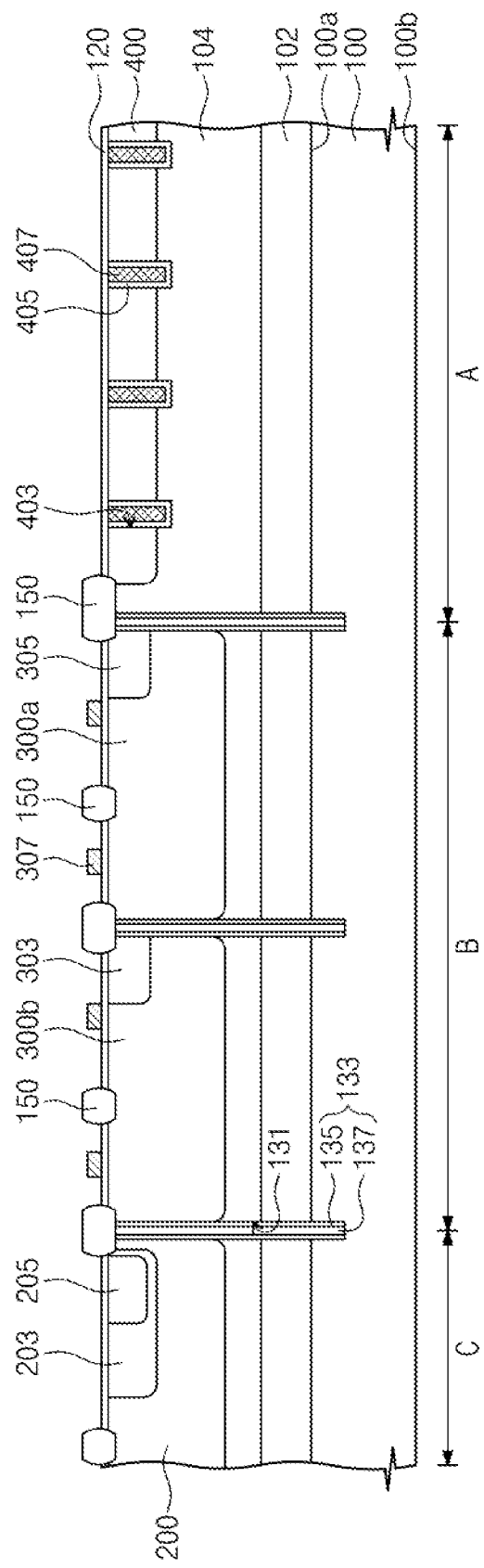

Referring to FIG. 11, a gate oxide layer 120 may be formed on the substrate 100. The gate oxide layer 120 may be formed by removing the fifth oxide layer 116 of FIG. 10 through wet etching and performing a dry oxidation process. Then, gate electrodes 307 may be formed on the gate oxide layer 120 of the second region B. The gate electrodes 307 may be formed by forming a polycrystalline silicon layer including phosphorus on the substrate 100 having the formed gate oxide layer 120 and patterning the formed polycrystalline silicon layer.

Figure 12:
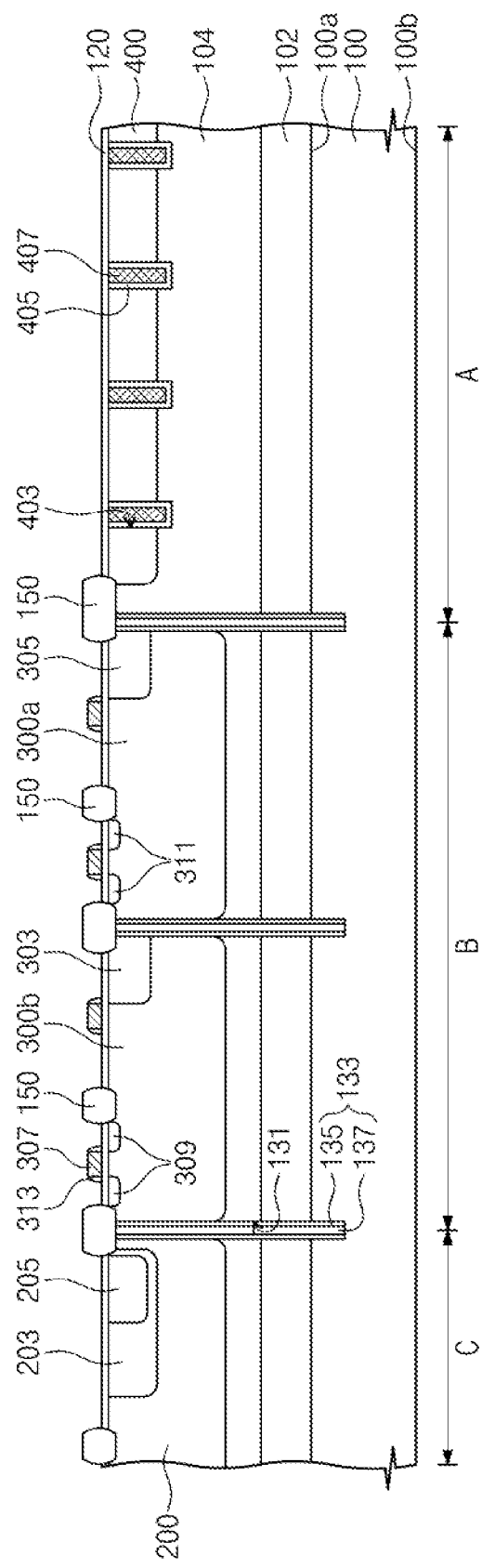

Referring to FIG. 12, n– lightly doped drains 309 (LDDs) may be formed in the p– well 300b of the second region B and p– LDDs 311 may be formed in the n– well 300a of the second region B. The n– LDDs 309 may be formed by forming an ion implantation mask (not shown) defining a region of the n– LDDs 309 on the substrate 100 having the formed gate electrodes 307 and ion-implanting an impurity such as phosphorus. Likewise, the p– LDDs 311 may be formed by forming an ion implantation mask (not shown) defining a region of the p– LDDs 311 on the substrate 100 having the formed gate electrodes 307 and ion-implanting an impurity such as boron. The n− LDDs 309 and the p− LDDs 311 may be formed sequentially.

Then, sidewall oxide layer 313 may be formed at both sidewalls of the gate electrodes 307. The sidewall oxide layers 313 may be formed by forming a tetra ethyl ortho silicate (TEOS) oxide layer and performing a dry etching process.

Figure 13:
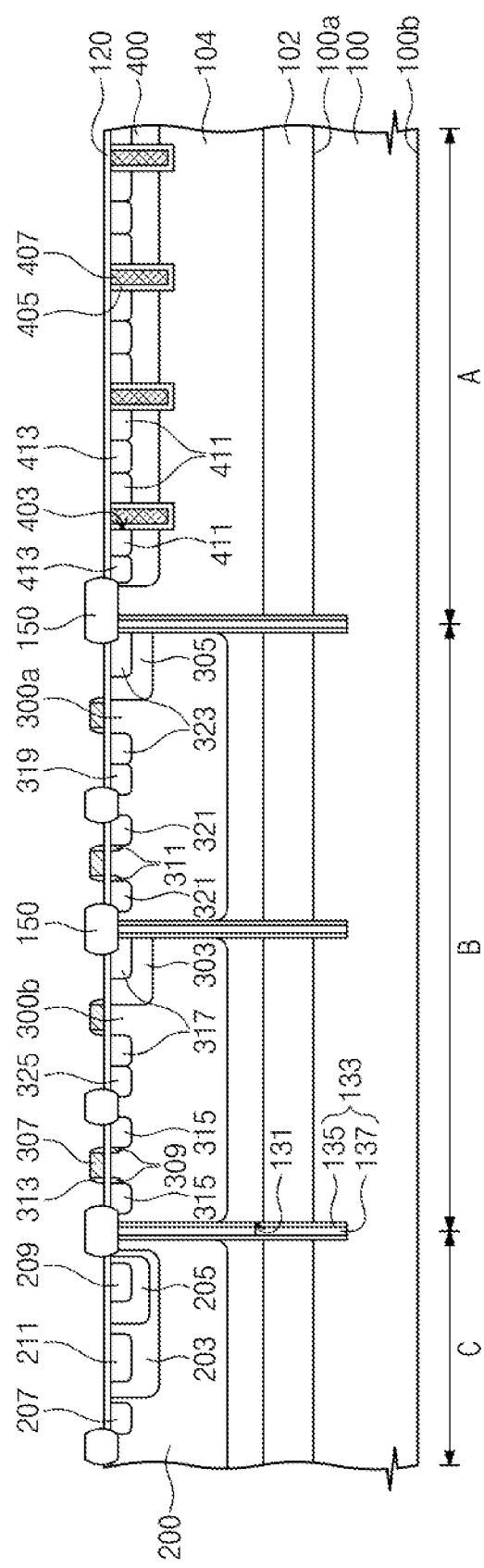

Referring to FIG. 13, a collector junction 207, an emitter junction 209, and a base junction 211 may be formed in the third region C. That is, the collector junction 207, the emitter junction 209, and the base junction 211 may be respectively formed in the collector 200, the emitter 205, and the base 203. The collector junction 207 and the emitter junction 209 may be doped with an n+ type and the base junction 211 may be doped with a p+ type.

n+ sources/drains 315 and 317 and a p+ ground region 325 may be formed in the p− well 300b of the second region B and p+ sources/drains 321 and 323 and an n+ ground region 319 may be formed in the n− well 300a. The n+ sources/drains 315 and 317 and the n+ ground region 319 may be doped with an n+ type, and the p+ sources/drains 321 and 323 and the p+ ground region 325 may be doped with a p+ type.

n+ sources 411 and p+ junctions 413 may be formed in the p− body region 400 of the first region A. The n+ sources 411 may be formed at the both sides of the buried gate electrodes 407 and the p+ junctions 413 may be formed between the n+ sources 411. The n+ sources 411 may be doped with an n+ type and the p+ junctions 413 may be doped with a p+ type.

The collector junction 207, the emitter junction 209, the base junction 211, the n+ sources/drains 315 and 317, the p+ ground region 325, the p+ sources/drains 321/323, the n+ ground region 319, the n+ sources 411, and the p+ junctions 413 may be formed by ion-implanting an n+ type impurity or a p+ type impurity by using ion implantation masks sequentially. As an example, the n+ type impurity includes arsenic and the p+ type impurity may include boron.

Figure 14:
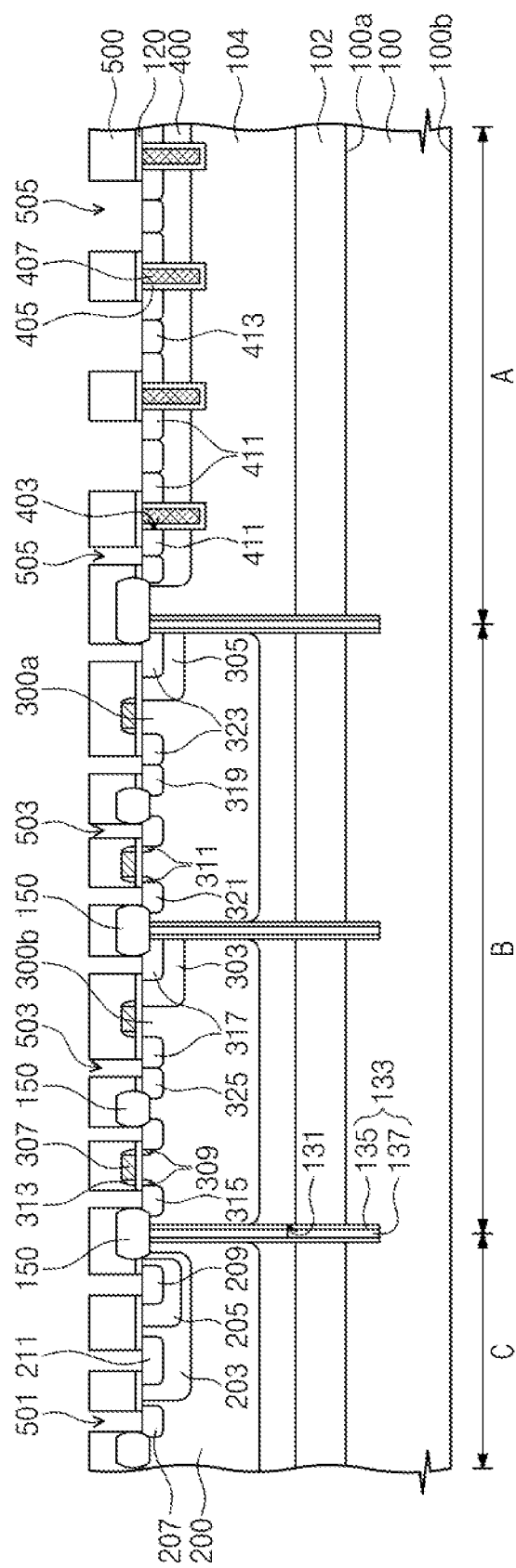

Referring to FIG. 14, an interlayer insulation layer 500 covering the gate electrodes 307 and first to third openings 501, 503, and 505 penetrating the interlayer insulation layer 500 may be formed on the substrate 100.

The interlayer insulation layer 500 may be formed by applying a tetra ethyl ortho silicate (TEOS) oxide layer and/or a boropho sphosilicate glass (BPSG) oxide layer and performing a planarization process through thermal treatment. The first to third openings 501, 503, and 505 may be formed by forming a mask pattern (not shown) on the substrate 100 having the formed interlayer insulation layer 500 and performing an etching process by using the mask pattern (not shown) as an etch mask. Such an etching process may include a wet and/or dry etching process. The first openings 501 may expose the collector function 207, the emitter junction 209, and the base junction 211 of the third region C. The second openings 503 may expose the n+ sources/drains 315 and 317, the p+ ground region 325, the p+ sources/drains 321 and 323, and the n+ ground region 319 of the second region B. The third openings 505 may expose the n+ sources 411 and the p+ junctions 413 of the first region A.

Figure 15:
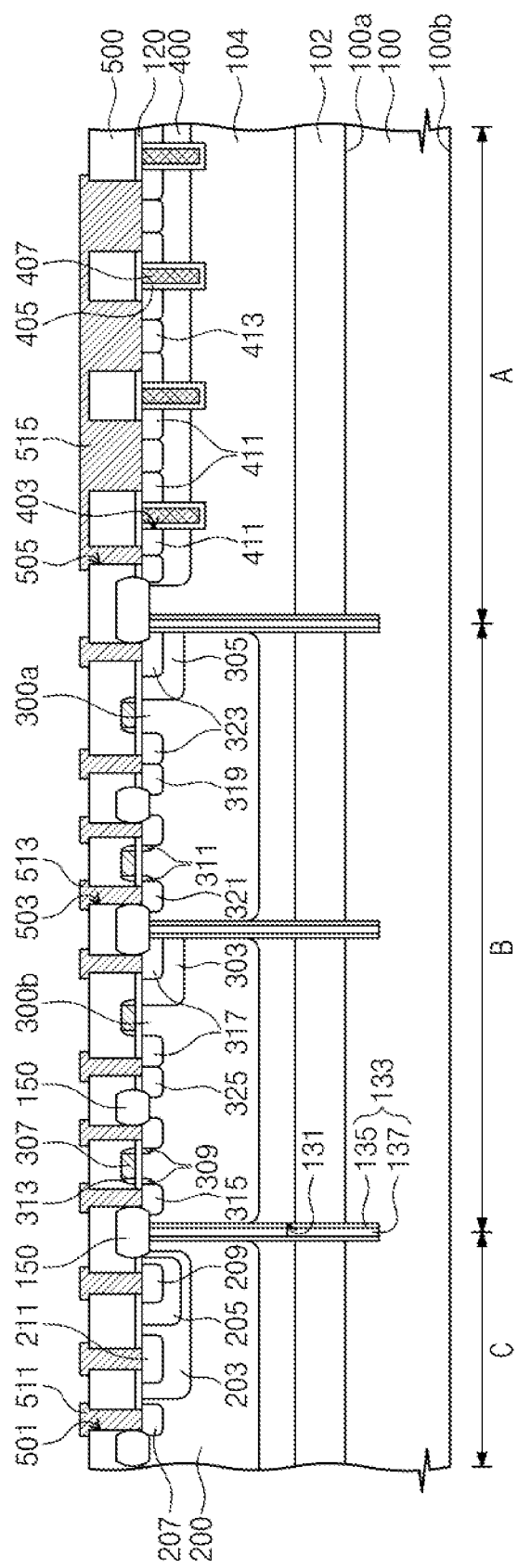

Referring to FIG. 15, metal lines 511, 513, and 515 filling the first to third openings 501, 503, and 505 may be formed. The metal lines 511, 513, and 515 may be formed by forming a metallic layer filling the first to third openings 501, 503, 505 and then performing a thermal treatment process. The metallic layer may be aluminum. The first metal lines 511 may be electrically connected to the collector junction 207, the emitter junction 209, and the base junction 211 of the third region C. The second metal lines 513 may be electrically connected to the n+ sources/drains 315 and 317, the p+ ground region 325, the p+ sources/drains 321 and 323, and the n+ ground region 319 of the second region B. The third metal lines 515 may be electrically connected to the n+ sources 411 and the p+ junctions 413 of the first region A.

Figure 16:
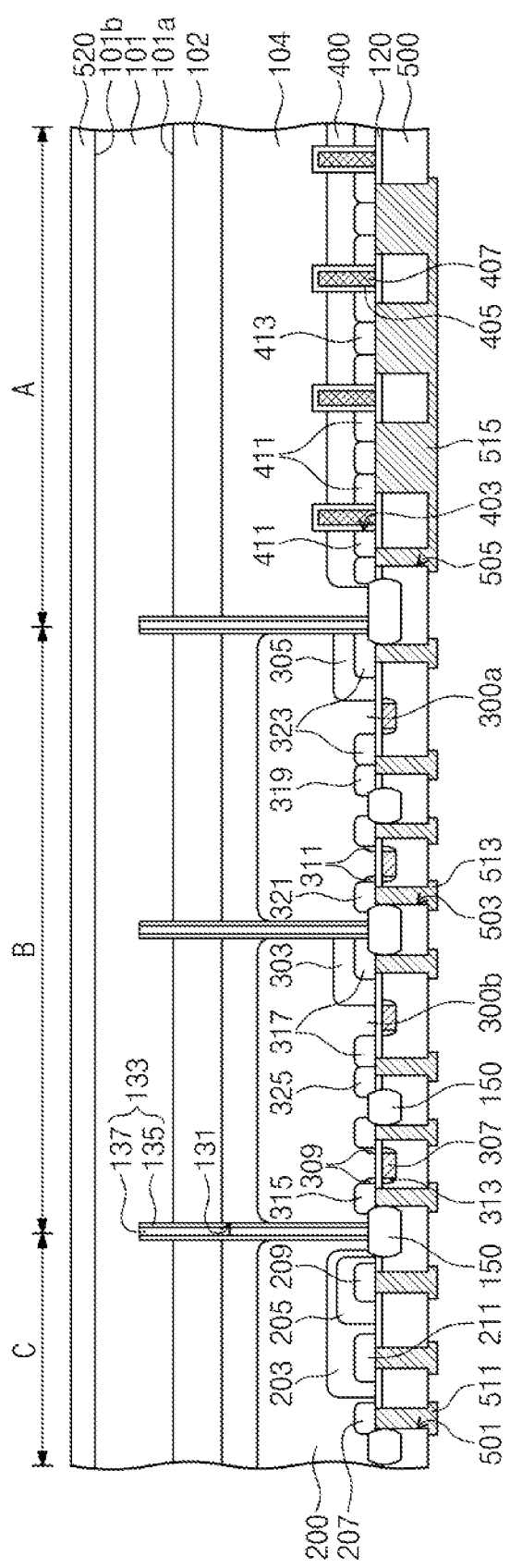

Referring to FIG. 16, a thin substrate 101 may be formed by performing a grinding process for removing the lower surface 100b of the substrate 100 of FIG. 15. The grinding process may include performing a taping operation for attaching a tape (not shown) to the substrate 100 of FIG. 15 having the formed metal lines 511, 513, and 515 and then performing a thinning operation on the lower surface 100b of the substrate 100 of FIG. 15. The taping operation may be performed to protect the front surface of the substrate 100 of FIG. 15 having the formed metal lines 511, 513, and 515. The thinned substrate 101 may have an upper surface 101a contacting the first epi layer 102 and a lower surface 101b facing the upper surface 101a.

Then, a first protective oxide layer 520 may be formed on the lower surface 101b of the thinned substrate 101. The first protective oxide layer 520 may include a silicon oxide layer and may be formed by performing a plasma-enhanced CVD (PECVD) process.

Figure 17:
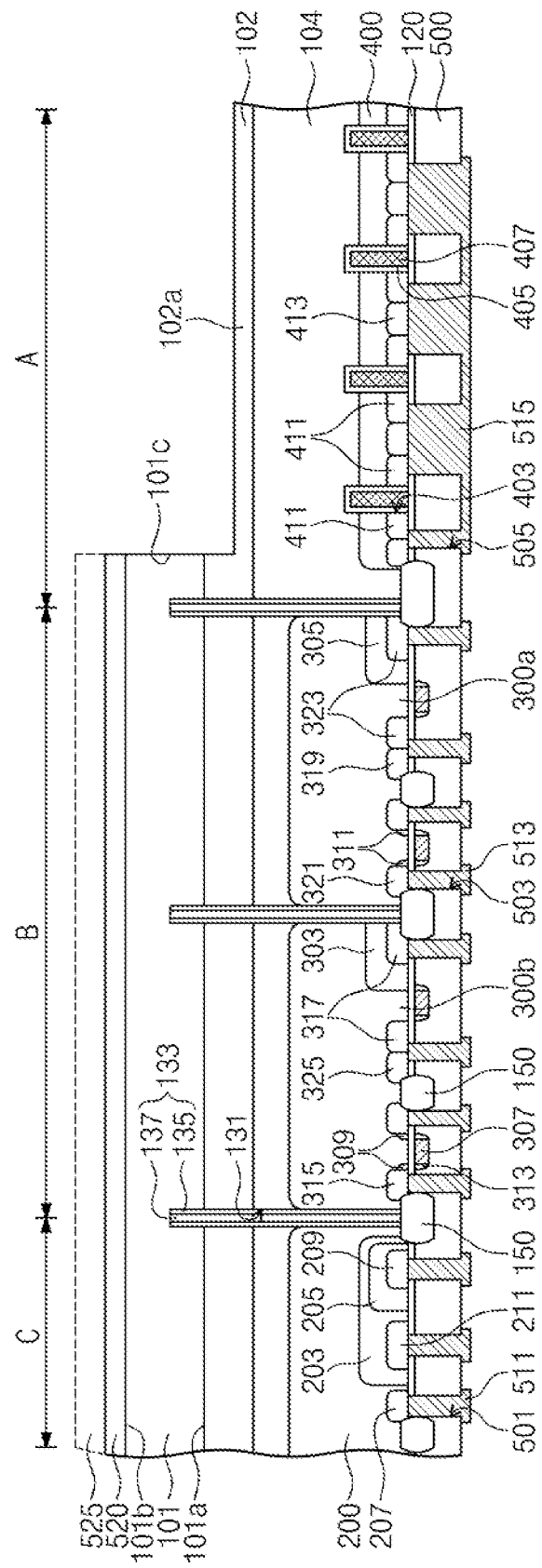

Referring to FIG. 17, portions of the first protective oxide layer 520 and the thinned substrate 101 may be removed. The removing of the portions of the first protective oxide layer 520 and the thinned substrate 101 may include forming a second photosensitive mask 525 exposing a portion of the first region A on the first protective oxide layer 520 and performing an anisotropic etching process by using the second photosensitive mask 525 as a mask. Such an etching process may be performed until the first epi layer 102 of the first region A is exposed. As a result, the portions of the first protective oxide layer 520 and the thinned substrate 101 are removed and one sidewall 101c of the thinned substrate 101 may be exposed. According to an embodiment of the inventive concept, a portion of the first epi layer 102 may be recessed due to over-etch during an etching process. That is, the first epi layer 102 may include the recessed first epi layer portion 102a.

Figure 18:
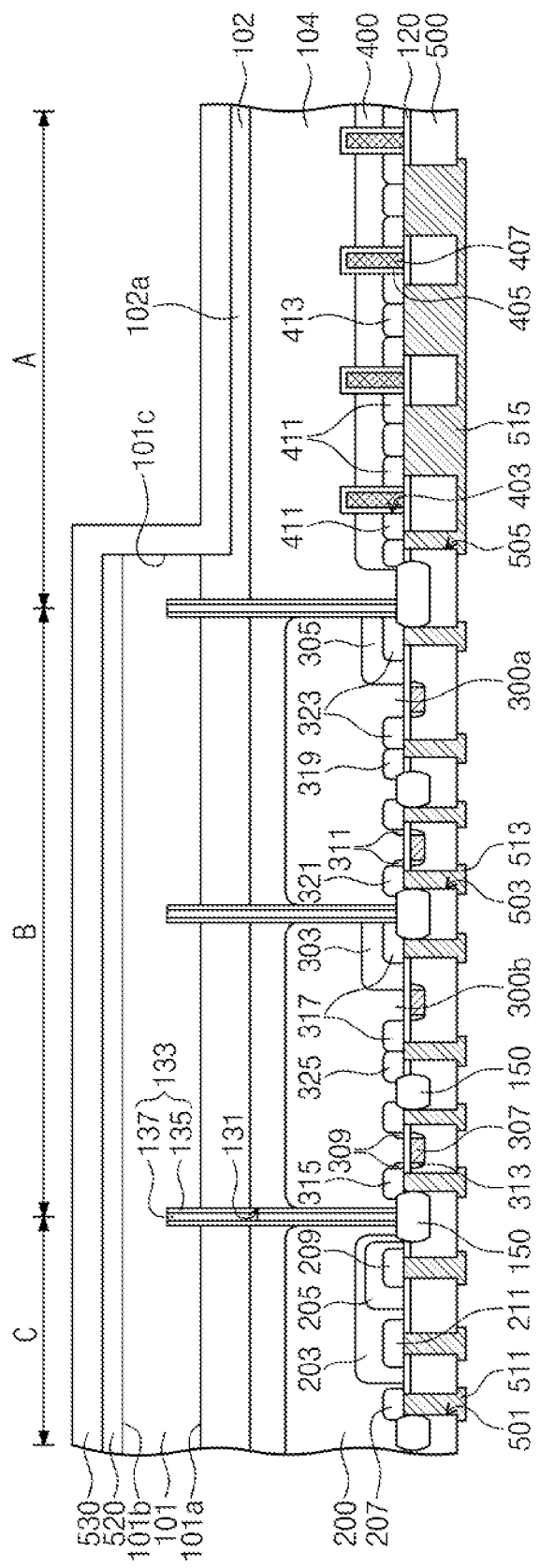

Referring to FIG. 18, after the second photosensitive mask 525 of FIG. 17 is removed, a second protective oxide layer 530 may be formed on an entire surface of a result where the portions of the first protective oxide layer 520 and the thinned substrate 101 are removed. That is, the second protective oxide layer 530 may be conformally formed on the lower surface 101b of the thinned substrate 101 where the second photosensitive mask 525 of FIG. 17 is removed. The second protective oxide layer 530 may cover the first protective oxide layer 520 and may extend into the one sidewall 101c of the thinned substrate 101 exposed by the etching process of FIG. 17. Additionally, the second protective oxide layer 530 may cover the recessed first epi layer portion 102a. According to an embodiment of the inventive concept, the second protective oxide layer 530 may be thicker than the first protective oxide layer 520. The second protective oxide layer 530 may include a silicon oxide layer and may be formed by the PECVD process.

Figure 19:
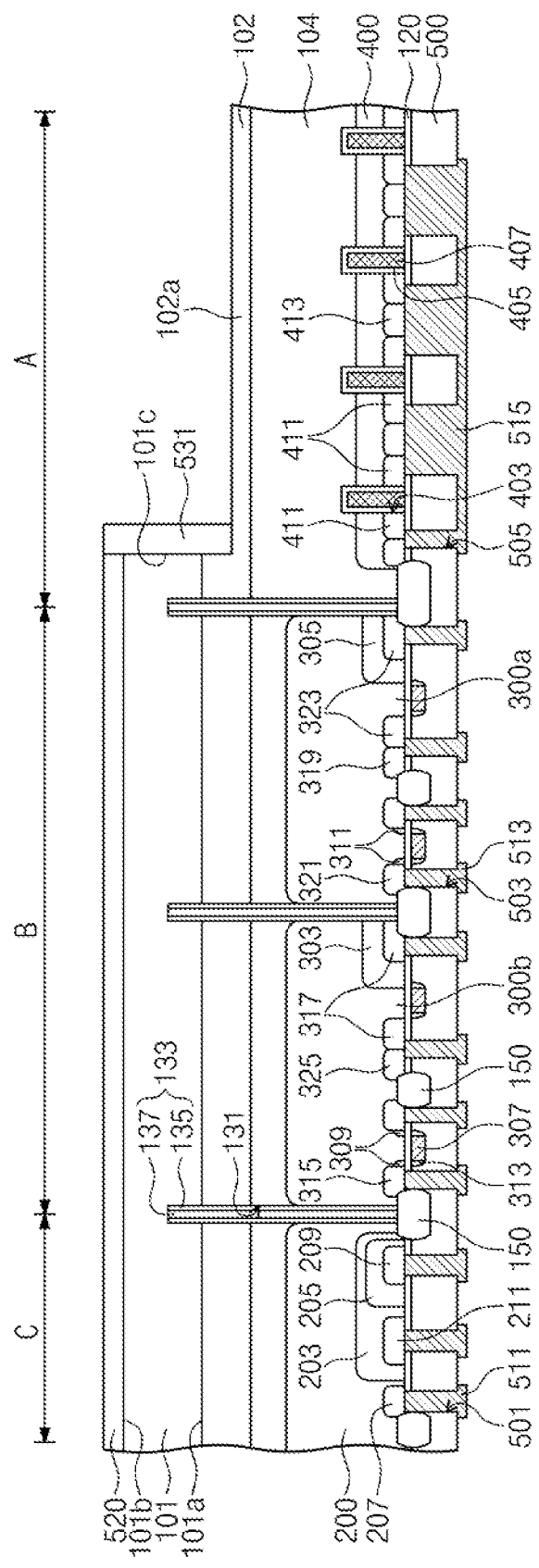

Referring to FIG. 19, a sidewall insulation pattern 531 may be formed on the one sidewall 101c of the thinned substrate 101. The sidewall insulation pattern 531 may be formed by performing a blanket anisotropic etching process on the result where the second protective oxide layer 530 is formed. The anisotropic etching process may be performed until the second protective oxide layer 530 on the recessed first epi layer portion 102a is removed. As a result, the second protective oxide layer 530 of FIG. 18 becomes the sidewall insulation pattern 531 limited on the one sidewall 101c of the thinned substrate 101. The lower surface of the sidewall insulation pattern 531 may contact the recessed first epi layer portion 102a. Additionally, as a result of an etching process, the first protective oxide layer 520 and the recessed first epi layer portion 102a may be exposed. The sidewall insulation pattern 531 may serve to isolate a device of the first region A from an adjacent device.

Figure 20:
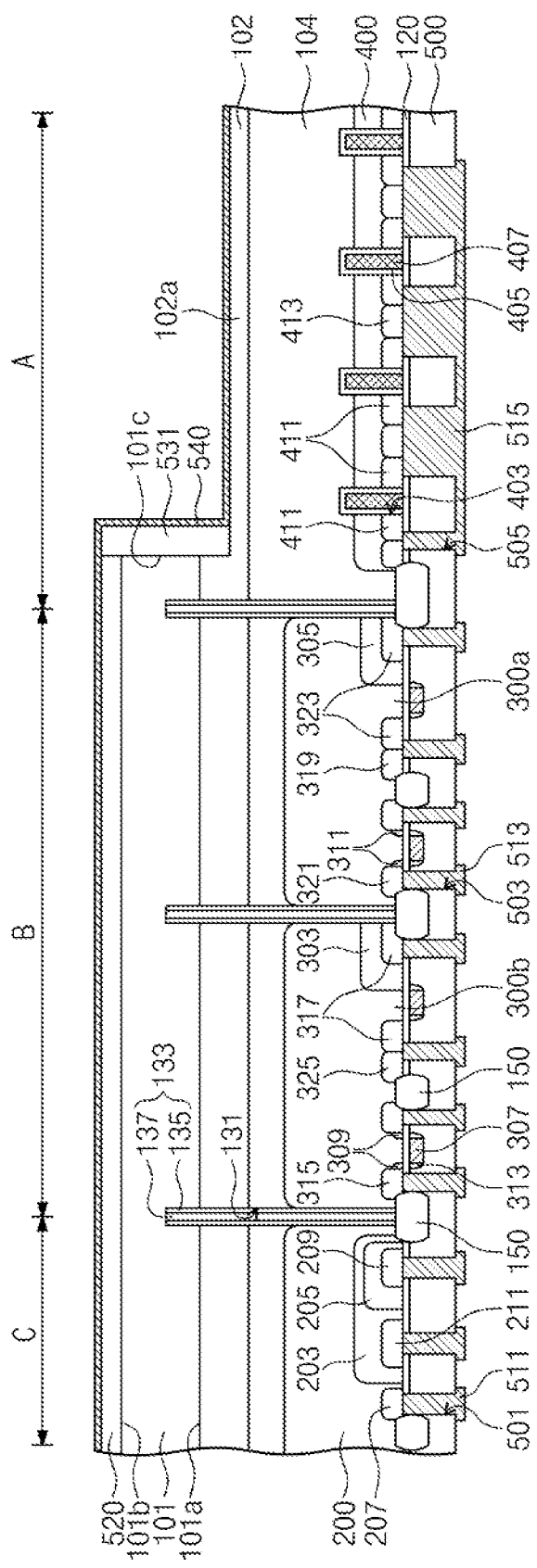

Referring to FIG. 20, an ohmic contact layer 540 may be formed on—an entire surface of a result having the formed sidewall insulation pattern 531. That is, the ohmic contact layer 540 may be formed to conformally cover the first protective oxide layer 520, the sidewall insulation pattern 531, and the recessed first epi layer portion 102a. The ohmic contact layer 540 may include a metallic material such as aluminum and may be formed by performing a metal deposition process or a plating process. The ohmic contact layer 540 may be formed to reduce an on-resistance of a device formed in the first region A.

Figure 21:
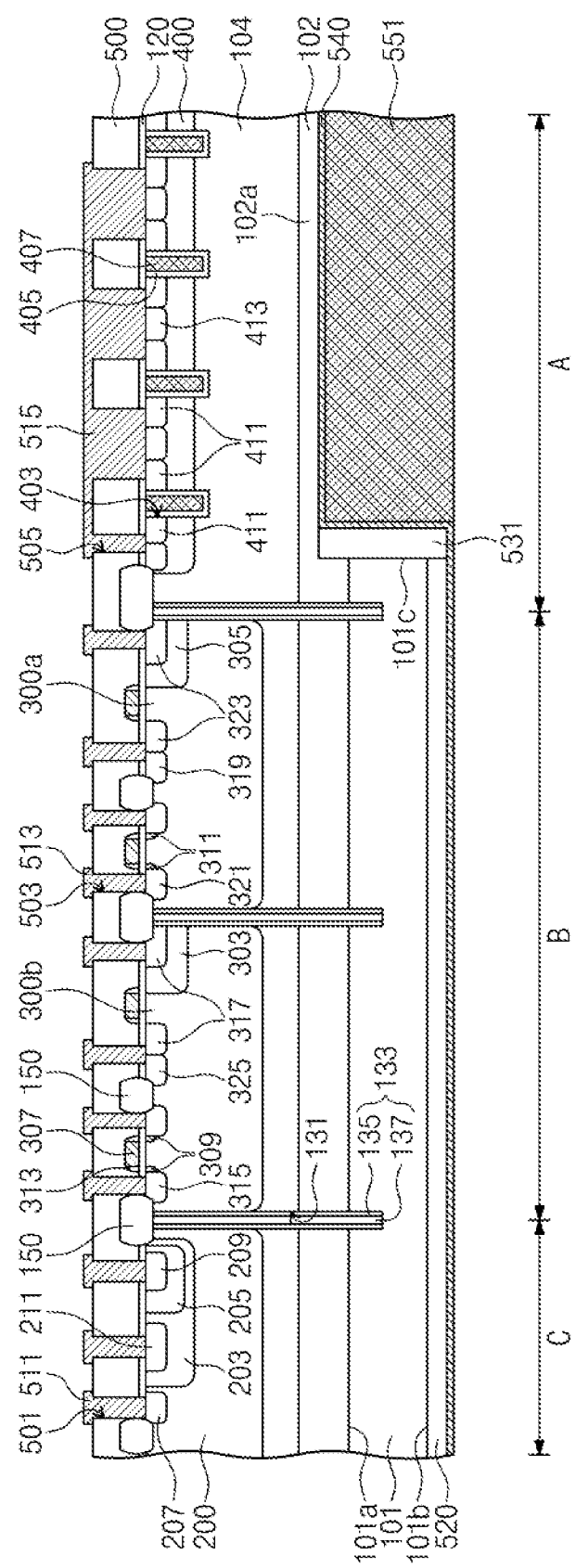

Referring to FIG. 21, a drain 551 may be formed on the recessed first epi layer portion 102a. The drain 551 may be formed by forming a mask pattern (not shown) defining a region where the drain 551 is to be formed on the result of FIG. 20 having the formed ohmic contact layer 540 and performing a plating process or a screen printing process. As a result, the drain 551 filling the region where the thinned substrate 101 is removed may be formed on the recessed first epi layer portion 102a. The drain 551 may include at least one of silver or copper. As an example, the plating process may be performed by using a material including at least one of silver and copper. Likewise, the screen printing process may be performed by using at least one of a silver paste or a copper paste.

Figure 22:
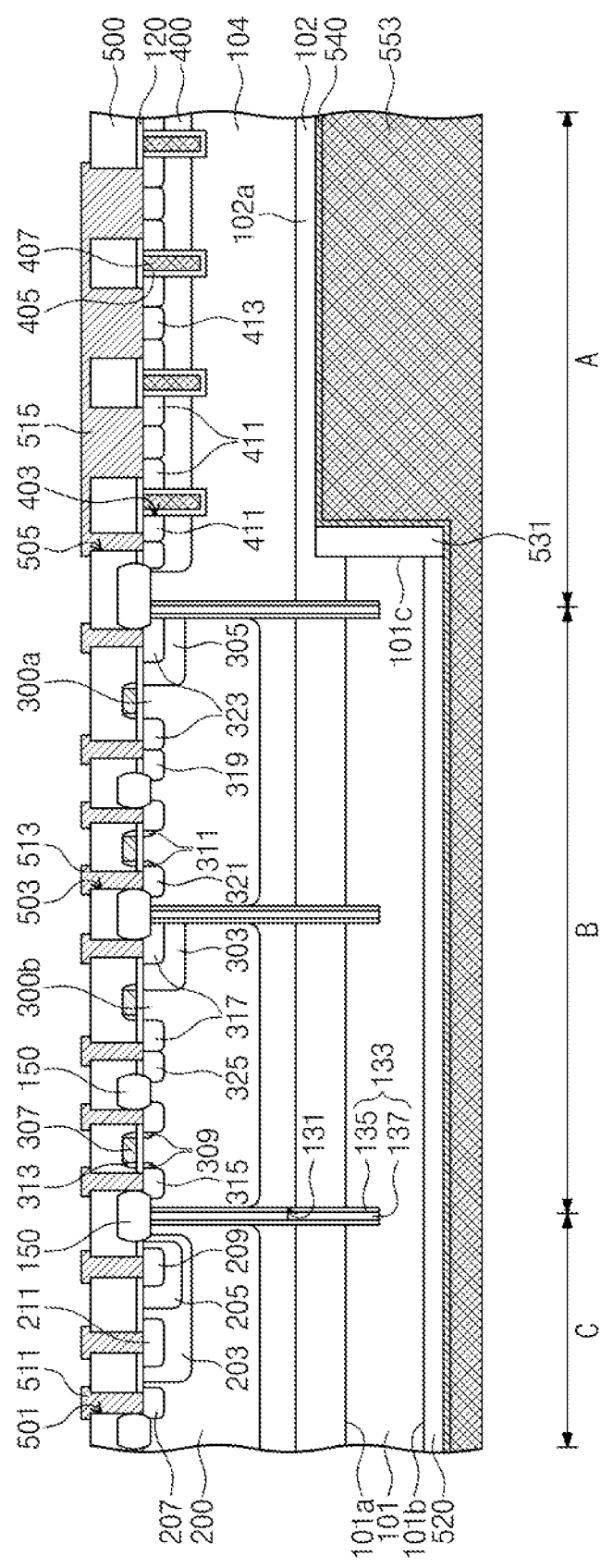

According to another embodiment of the inventive concept, the drain 551 may be formed on an entire surface of the result having the ohmic contact layer 540 as shown in FIG. 22. The drain 551 may be formed by performing a plating process or a screen printing process on the front surface of the result of FIG. 20 having the formed ohmic contact layer 540. As a result, the drain 551 may cover the recessed first epi layer portion 102a and may extend on the lower surface 101b of the thinned substrate 101.

Through the above-mentioned series of processes, different devices may be formed in the first to third regions A, B, and C.

The first region A may be defined as a region of a first device. For example, the first region A may be defined as a region of a diffused metal-oxide-semiconductor (DMOS) device. The DMOS device may be a trench double diffused metal-oxide-semiconductor (TDMOS) device. The first device may be used as a power control circuit. For example, the first device may be used as a high current switch.

The second region B may be defined as a region of a second device. For example, the second region B may be defined as a region of a CMOS device. The CMOS device may be at least one of PMOS, ED-PMOS, NMOS, or ED-NMOS. At least one of the CMOS devices may be used as a low voltage device or a high voltage device. The second device may be used as a digital device. For example, the second device may be used as a signal control circuit.

The third region C may be defined as a region of a third device. For example, the third device may be a bipolar device. The third device may be used as an analog device. For example, the third device may be included in a temperature sensor.

A typical smart power IC may be affected. For example, a low voltage CMOS device and/or a bipolar device may be damaged when a high voltage bias is applied to a substrate drain of a high voltage device.

However, according to embodiments of inventive concepts, each device is formed on the p– type substrate 100 and an isolation structure between each device is provided through a trench isolation technique, so that a highly reliable semiconductor device may be provided. As an example, when a high voltage bias is applied to a first device on the first region A, current flows through the ohmic contact layer 540, the epi layers 102 and 104, and the p– body region 400 but current may not flow into the second and third regions B and C by the device isolation patterns 133 and the sidewall insulation pattern 531. Thus, current is prevented from flowing into the second device on the second region B and the third device on the third region C, so that the stabilization of a control circuit may be achieved.

Additionally, since the drain 551 is formed on the lower surface of the first epi layer 102, the first device on the first region A may provide a structure in which current is applied in a vertical direction. Accordingly, high current drive characteristics may be improved and low on-resistance may be provided, so that the efficiency of a semiconductor device may be improved.

According to embodiments of inventive concepts, a semiconductor device provides a smart power IC including a trench double diffused metal-oxide-semiconductor (TDMOS) power device instead of a vertical double diffused metal-oxide-semiconductor (VDMOS) power device. As a result, a high current device with a small size and excellent current driving may be implemented.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A semiconductor device comprising:
  a first semiconductor layer having a first region with a first device and a second region with a second device;
  a device isolation pattern provided in the first semiconductor layer and electrically separating the first device and the second device from each other;
  a drain provided on a lower surface of the first region of the first semiconductor layer; and
  a second semiconductor layer provided on a lower surface of the second region of the first semiconductor layer.

2. The semiconductor device of claim 1, further comprising a sidewall insulation pattern between the drain and the second semiconductor layer.

3. The semiconductor device of claim 1, further comprising an ohmic contact layer between the first semiconductor layer and the drain.

4. The semiconductor device of claim 1, wherein the drain extends on a lower surface of the second semiconductor layer.

5. The semiconductor device of claim 1, wherein the device isolation pattern penetrates the first semiconductor layer and extends into the second semiconductor layer.

6. The semiconductor device of claim 1, wherein a conductive type of the first semiconductor layer is an n-type, and a conductive type of the second semiconductor layer is a p-type.

7. The semiconductor device of claim 6, wherein the first semiconductor layer comprises a first epi layer contacting the second semiconductor layer and a second epi layer on the first epi layer; and the first epi layer has an impurity concentration higher than that of the second epi layer.

8. The semiconductor device of claim 1, wherein the first device is a diffused metal-oxide-semiconductor (DMOS) transistor.

9. The semiconductor device of claim 1, wherein the first device comprises a source and a buried gate electrode, wherein the source and the buried gate electrode are connected to metal lines provided on the first semiconductor layer.

10. The semiconductor device of claim 1, wherein the second device is a complementary metal-oxide semiconductor (CMOS) device.

11. The semiconductor device of claim 1, wherein the first semiconductor layer further has a third region with a third device, wherein the third device is a bipolar transistor.

12. A method of fabricating a semiconductor device, the method comprising:
 sequentially forming first and second epi layers on a substrate having a first region, a second region, and a third region;
 removing a portion of the first region of the substrate to expose the first epi layer; and
 forming a drain on a lower surface of the exposed first epi layer.

13. The method of claim 12, wherein the forming of the drain comprises performing a plating process or a screen print process.

14. The method of claim 12, further comprising forming device isolation patterns on the substrate,
 wherein the forming of the device isolation patterns comprises:
 forming trenches penetrating the first and second epi layers on the substrate and extending into the substrate;
 forming trench insulation patterns covering a sidewall of the trenches; and
 forming trench gap fill patterns filling the trenches where the trench insulation patterns are formed,
 wherein the trench gap fill patterns comprise a polycrystalline silicon layer.

15. The method of claim 12, further comprising thinning the substrate before the removing of the portion of the first region, wherein the thinning of the substrate comprises performing a grinding process.

16. The method of claim 12, further comprising forming a sidewall insulation pattern on a sidewall of the substrate where the portion of the first region is removed before the forming of the drain,
 wherein the forming of the sidewall insulation pattern comprises:
 forming a protective oxide layer covering the sidewall on the lower surface of the substrate region; and
 performing a blanket anisotropic etching process on the lower surface of the substrate where the protective layer is formed.

17. The method of claim 12, further comprising forming an ohmic contact layer on a lower surface of the exposed first epi layer before the forming of the drain, wherein the forming of the ohmic contact layer comprises performing a metal deposition process or a plating process.

18. The method of claim 12, further comprising:
 forming a DMOS device on the first region;
 forming a CMOS device on the second region; and
 forming a bipolar device on the third region.

* * * * *